(12) United States Patent
Lefevre et al.

(10) Patent No.: US 11,431,282 B2
(45) Date of Patent: Aug. 30, 2022

(54) GLASS COVER WITH OPTICAL-FILTERING COATING FOR MANAGING COLOR OF A SOLAR ROOF TILE

(71) Applicant: Tesla, Inc., Austin, TX (US)

(72) Inventors: Ollivier J. Lefevre, Pleasanton, CA (US); John Liu, Fremont, CA (US)

(73) Assignee: Tesla, Inc., Austin, TX (US)

( * ) Notice: Subject to any disclaimer, the term of this patent is extended or adjusted under 35 U.S.C. 154(b) by 0 days.

(21) Appl. No.: 17/199,303

(22) Filed: Mar. 11, 2021

(65) Prior Publication Data

US 2021/0203272 A1 Jul. 1, 2021

Related U.S. Application Data

(63) Continuation of application No. 15/719,244, filed on Sep. 28, 2017, now Pat. No. 10,978,990.

(51) Int. Cl.
*H02S 20/25* (2014.01)
*H01L 31/049* (2014.01)
(Continued)

(52) U.S. Cl.
CPC ............ *H02S 20/25* (2014.12); *E04D 1/16* (2013.01); *E04D 1/28* (2013.01); *E04D 1/30* (2013.01); *G02B 1/11* (2013.01); *G02B 5/22* (2013.01); *H01L 31/02162* (2013.01); *H01L 31/02167* (2013.01); *H01L 31/048* (2013.01); *H01L 31/049* (2014.12); *H01L 31/0549* (2014.12);
(Continued)

(58) Field of Classification Search
CPC . H01L 31/048; H01L 31/049; H01L 31/0549; H01L 31/02165; H01L 31/02167; H01L 31/02168; H01L 31/043–0468; H01L 31/076; H02S 20/25; H02S 40/22; H02S 40/36; E04D 1/28; E04D 1/30; G02B 1/11; G02B 5/22
See application file for complete search history.

(56) References Cited

U.S. PATENT DOCUMENTS 3,076,861 A 2/1963 Samulon et al.
3,369,939 A 2/1968 Myer
(Continued)

FOREIGN PATENT DOCUMENTS

CN 102544380 B 8/2015
CN 103426957 B 3/2016
(Continued)

OTHER PUBLICATIONS

Final Office Action received for U.S. Appl. No. 15/598,194, dated Jun. 22, 2018, 17 pages.
(Continued)

*Primary Examiner* — Andrew J Golden
(74) *Attorney, Agent, or Firm* — Dentons US LLP

(57) ABSTRACT

One embodiment can provide a solar roof tile. The solar roof tile can include a front cover, a back cover, one or more photovoltaic structures positioned between the front cover and the back cover, and an optical filter positioned between the front cover and the photovoltaic structures. The optical filter is configured to block light within a predetermined spectral range, thereby preventing the light from reflecting off surfaces of the photovoltaic structures to exit the solar roof tile.

17 Claims, 11 Drawing Sheets

(51) Int. Cl.
*H01L 31/054* (2014.01)
*G02B 5/22* (2006.01)
*G02B 1/11* (2015.01)
*E04D 1/30* (2006.01)
*E04D 1/28* (2006.01)
*H02S 40/36* (2014.01)
*H01L 31/048* (2014.01)
*H01L 31/0216* (2014.01)
*H02S 40/22* (2014.01)
*E04D 1/16* (2006.01)

(52) U.S. Cl.
CPC ........ *H02S 40/36* (2014.12); *E04D 2001/308* (2013.01); *H02S 40/22* (2014.12)

(56) References Cited

U.S. PATENT DOCUMENTS

| | | | |
|---|---|---|---|
| 3,461,602 A | 8/1969 | Hasel et al. | |
| 4,239,810 A | 12/1980 | Alameddine et al. | |
| 4,461,922 A * | 7/1984 | Gay | H01L 31/048 |
| | | | 257/E27.125 |
| 4,713,493 A * | 12/1987 | Ovshinsky | H01L 31/048 |
| | | | 136/249 |
| 4,724,011 A | 2/1988 | Turner et al. | |
| 5,118,540 A | 6/1992 | Hutchison | |
| 5,149,351 A | 9/1992 | Yaba et al. | |
| 5,338,369 A | 8/1994 | Rawlings | |
| 5,427,961 A | 6/1995 | Takenouchi et al. | |
| 5,590,495 A | 1/1997 | Bressler et al. | |
| 5,667,596 A | 9/1997 | Tsuzuki et al. | |
| 5,942,048 A | 8/1999 | Fujisaki et al. | |
| 6,133,522 A | 10/2000 | Kataoka et al. | |
| 6,307,144 B1 | 10/2001 | Mimura et al. | |
| 6,311,436 B1 | 11/2001 | Mimura et al. | |
| 6,365,824 B1 | 4/2002 | Nakazima et al. | |
| 6,472,594 B1 | 10/2002 | Ichinose et al. | |
| 6,515,216 B2 | 2/2003 | Zenko et al. | |
| 6,586,271 B2 | 7/2003 | Hanoka | |
| 6,620,645 B2 | 9/2003 | Chandra et al. | |
| 6,960,716 B2 | 11/2005 | Matsumi et al. | |
| 7,259,321 B2 | 8/2007 | Oswald et al. | |
| 7,276,724 B2 | 10/2007 | Sheats et al. | |
| 7,506,477 B2 | 3/2009 | Flaherty et al. | |
| 7,534,956 B2 | 5/2009 | Kataoka et al. | |
| 7,772,484 B2 | 8/2010 | Li et al. | |
| 7,833,808 B2 | 11/2010 | Xu et al. | |
| 7,851,700 B2 | 12/2010 | Luch | |
| 7,858,874 B2 | 12/2010 | Ruskin et al. | |
| 7,902,451 B2 | 3/2011 | Shimizu | |
| 7,964,440 B2 | 6/2011 | Salleo et al. | |
| 8,205,400 B2 | 6/2012 | Allen | |
| 8,206,664 B2 | 6/2012 | Lin | |
| 8,276,329 B2 | 10/2012 | Lenox | |
| 8,471,141 B2 | 6/2013 | Stancel et al. | |
| 8,664,030 B2 | 3/2014 | Luch | |
| 8,674,377 B2 | 3/2014 | Farquhar | |
| 8,701,360 B2 | 4/2014 | Ressler | |
| 8,713,861 B2 | 5/2014 | Desloover | |
| 8,822,810 B2 | 9/2014 | Luch | |
| 9,038,330 B2 | 5/2015 | Bellavia | |
| 9,150,966 B2 | 10/2015 | Xu et al. | |
| 9,206,520 B2 | 12/2015 | Barr et al. | |
| 9,343,592 B2 | 5/2016 | Hunt | |
| 9,362,527 B2 | 6/2016 | Takemura | |
| 9,412,884 B2 | 8/2016 | Heng et al. | |
| 9,525,092 B2 | 12/2016 | Mayer et al. | |
| 9,825,582 B2 | 11/2017 | Fernandes et al. | |
| 9,882,077 B2 | 1/2018 | Morad et al. | |
| 9,899,554 B2 | 2/2018 | Yang et al. | |
| 9,966,487 B2 | 5/2018 | Magnusdottir et al. | |
| 10,056,522 B2 | 8/2018 | Gonzalez | |
| 10,145,116 B2 | 12/2018 | Holt et al. | |
| 10,381,973 B2 | 8/2019 | Liu et al. | |
| 2001/0054435 A1 | 12/2001 | Nagao et al. | |
| 2002/0015782 A1 | 2/2002 | Abys et al. | |
| 2002/0182769 A1 * | 12/2002 | Campbell | H01L 31/07 |
| | | | 438/97 |
| 2002/0185171 A1 | 12/2002 | Huang et al. | |
| 2003/0180983 A1 | 9/2003 | Oswald et al. | |
| 2004/0261840 A1 | 12/2004 | Schmit et al. | |
| 2005/0039788 A1 | 2/2005 | Blieske et al. | |
| 2005/0268963 A1 | 12/2005 | Jordan et al. | |
| 2006/0048798 A1 | 3/2006 | Mccoy et al. | |
| 2006/0086620 A1 | 4/2006 | Chase et al. | |
| 2006/0204730 A1 | 9/2006 | Nakamura et al. | |
| 2007/0289623 A1 * | 12/2007 | Atwater | H01L 31/035236 |
| | | | 136/252 |
| 2008/0135085 A1 | 6/2008 | Corrales et al. | |
| 2008/0156372 A1 * | 7/2008 | Wu | H01L 31/022466 |
| | | | 136/260 |
| 2008/0178932 A1 | 7/2008 | Den et al. | |
| 2009/0101192 A1 | 4/2009 | Kothari et al. | |
| 2009/0120497 A1 | 5/2009 | Schetty, III | |
| 2009/0133738 A1 | 5/2009 | Shiao et al. | |
| 2009/0133739 A1 | 5/2009 | Shiao et al. | |
| 2009/0133740 A1 | 5/2009 | Shiao et al. | |
| 2009/0165849 A1 * | 7/2009 | Chan | H01L 31/02167 |
| | | | 136/256 |
| 2009/0233083 A1 | 9/2009 | Inoue et al. | |
| 2009/0242021 A1 | 10/2009 | Petkie et al. | |
| 2009/0255568 A1 | 10/2009 | Morgan | |
| 2009/0287446 A1 | 11/2009 | Wang et al. | |
| 2009/0308435 A1 | 12/2009 | Caiger | |
| 2010/0000603 A1 | 1/2010 | Tsuzuki et al. | |
| 2010/0006147 A1 | 1/2010 | Nakashima et al. | |
| 2010/0018568 A1 | 1/2010 | Nakata | |
| 2010/0065116 A1 | 3/2010 | Stancel et al. | |
| 2010/0132762 A1 | 6/2010 | Graham et al. | |
| 2010/0147363 A1 | 6/2010 | Huang et al. | |
| 2010/0147364 A1 | 6/2010 | Gonzalez et al. | |
| 2010/0180929 A1 | 7/2010 | Raymond et al. | |
| 2010/0282318 A1 | 11/2010 | Kalkanoglu et al. | |
| 2011/0023937 A1 | 2/2011 | Daniel et al. | |
| 2011/0023942 A1 | 2/2011 | Soegding et al. | |
| 2011/0030761 A1 | 2/2011 | Kalkanoglu et al. | |
| 2011/0277825 A1 | 11/2011 | Fu et al. | |
| 2012/0000502 A1 | 1/2012 | Wiedeman et al. | |
| 2012/0012162 A1 | 1/2012 | Kobayashi | |
| 2012/0031470 A1 | 2/2012 | Dimov et al. | |
| 2012/0048349 A1 | 3/2012 | Metin et al. | |
| 2012/0060911 A1 | 3/2012 | Fu et al. | |
| 2012/0125391 A1 | 5/2012 | Pinarbasi et al. | |
| 2012/0199184 A1 | 8/2012 | Nie et al. | |
| 2012/0204939 A1 * | 8/2012 | Lee | H01L 31/043 |
| | | | 257/E31.127 |
| 2012/0237670 A1 | 9/2012 | Lim et al. | |
| 2012/0285508 A1 * | 11/2012 | Lee | H01L 31/043 |
| | | | 136/246 |
| 2013/0048062 A1 | 2/2013 | Min et al. | |
| 2013/0061913 A1 | 3/2013 | Willham et al. | |
| 2013/0160823 A1 | 6/2013 | Khouri et al. | |
| 2013/0206213 A1 | 8/2013 | He et al. | |
| 2013/0209776 A1 | 8/2013 | Kim | |
| 2013/0233378 A1 | 9/2013 | Moslehi et al. | |
| 2013/0247959 A1 | 9/2013 | Kwon et al. | |
| 2013/0255755 A1 | 10/2013 | Chich | |
| 2013/0280521 A1 | 10/2013 | Mori | |
| 2014/0120699 A1 | 5/2014 | Hua et al. | |
| 2014/0124014 A1 | 5/2014 | Morad et al. | |
| 2014/0196768 A1 | 7/2014 | Heng et al. | |
| 2014/0313574 A1 | 10/2014 | Bills et al. | |
| 2014/0342492 A1 | 11/2014 | Choi et al. | |
| 2014/0360582 A1 | 12/2014 | Cui et al. | |
| 2015/0022876 A1 | 1/2015 | Ma et al. | |
| 2015/0090314 A1 | 4/2015 | Yang et al. | |
| 2015/0155824 A1 | 6/2015 | Chien | |
| 2015/0194552 A1 | 7/2015 | Ogasahara et al. | |
| 2015/0243931 A1 | 8/2015 | Fukuura | |
| 2015/0270410 A1 | 9/2015 | Heng et al. | |
| 2015/0349145 A1 | 12/2015 | Morad et al. | |
| 2015/0349152 A1 | 12/2015 | Voss et al. | |
| 2015/0349703 A1 | 12/2015 | Morad et al. | |
| 2016/0013329 A1 | 1/2016 | Brophy et al. | |

(56) References Cited

U.S. PATENT DOCUMENTS

| | | |
|---|---|---|
| 2016/0020338 A1 | 1/2016 | Beck et al. |
| 2016/0105144 A1 | 4/2016 | Haynes et al. |
| 2016/0163902 A1 | 6/2016 | Podlowski |
| 2016/0181446 A1 | 6/2016 | Kalkanoglu et al. |
| 2016/0225931 A1 | 8/2016 | Heng et al. |
| 2017/0033250 A1 | 2/2017 | Ballif et al. |
| 2017/0077343 A1 | 3/2017 | Morad et al. |
| 2017/0141244 A1 | 5/2017 | Khaled |
| 2017/0194516 A1 | 7/2017 | Reddy et al. |
| 2017/0222082 A1 | 8/2017 | Lin et al. |
| 2018/0115275 A1 | 4/2018 | Flanigan et al. |
| 2018/0123504 A1 | 5/2018 | Almy et al. |
| 2018/0158974 A1 | 6/2018 | Hiraki et al. |
| 2018/0166601 A1 | 6/2018 | Inaba |
| 2019/0097571 A1 | 3/2019 | Lefevre et al. |
| 2020/0007074 A1 | 1/2020 | Peterson et al. |
| 2021/0044250 A1 | 2/2021 | Liu et al. |

FOREIGN PATENT DOCUMENTS

| | | |
|---|---|---|
| CN | 102956730 B | 6/2016 |
| DE | 102007054124 A1 | 5/2009 |
| EP | 1058320 A2 | 12/2000 |
| EP | 2051124 A2 | 4/2009 |
| EP | 2709160 A1 | 3/2014 |
| GB | 2278618 A | 12/1994 |
| GB | 2431773 A | 5/2007 |
| JP | 57-141979 A | 9/1982 |
| JP | 60-20586 A | 2/1985 |
| JP | 6-140657 A | 5/1994 |
| JP | 6-264571 A | 9/1994 |
| JP | 2000-91610 A | 3/2000 |
| JP | 2000-216415 A | 8/2000 |
| JP | 2013-211385 A | 10/2013 |
| TW | 201039452 A | 11/2010 |
| WO | 2008/136872 A2 | 11/2008 |
| WO | 2009/062106 A1 | 5/2009 |
| WO | 2009/099418 A2 | 8/2009 |
| WO | 2010/128375 A2 | 11/2010 |
| WO | 2011/128757 A1 | 10/2011 |
| WO | 2013/059441 A1 | 4/2013 |
| WO | 2013/067541 A1 | 5/2013 |
| WO | 2013/102181 A1 | 7/2013 |
| WO | 2014/178180 A1 | 11/2014 |
| WO | 2015/155356 A1 | 10/2015 |
| WO | 2016/090341 A1 | 6/2016 |
| WO | 2018/158470 A2 | 9/2018 |

OTHER PUBLICATIONS

Final Office Action received for U.S. Appl. No. 16/025,834, dated Apr. 10, 2020, 11 pages.
First Action Interview Office Action received for U.S. Appl. No. 15/598,194, dated Feb. 12, 2018, 7 pages.
International Preliminary Report on Patentability received for PCT Patent Application No. PCT/US2018/030492, dated Nov. 28, 2019, 9 pages.
International Search Report and Written Opinion received for PCT Patent Application No. PCT/US2018/030492, dated Jul. 20, 2018, 12 pages.
International Search Report and Written Opinion received for PCT Patent Application No. PCT/US2020/044790, dated Feb. 3, 2021, 19 pages.
Invitation to Pay Additional Fees received for PCT Patent Application No. PCT/US2020/044790, dated Nov. 5, 2020, 9 pages.
Non-Final Office Action received for U.S. Appl. No. 16/025,834, dated Dec. 24, 2020, 14 pages.
Non-Final Office Action received for U.S. Appl. No. 16/025,834, dated Sep. 6, 2019, 10 pages.
Non-Final Office Action received for U.S. Appl. No. 16/533,524, dated Sep. 3, 2020, 16 pages.
Notice of Allowance received for U.S. Appl. No. 15/598,194, dated Apr. 3, 2019, 11 pages.
Pre-Interview First Office Action received for U.S. Appl. No. 15/598,194, dated Dec. 21, 2017, 5 pages.
Lin et al., "Fabrication of Antireflective Nanostructures for Crystalline Silicon Solar Cells by Reactive Ion Etching", Thin Solid Films 529, 2013, pp. 138-142.
Advisory Action received for U.S. Appl. No. 15/719,244, dated Aug. 12, 2020, 6 pages.
Final Office Action received for U.S. Appl. No. 15/719,244, dated Feb. 19, 2020, 22 pages.
First Action Interview—Office Action received for U.S. Appl. No. 15/719,244, dated Aug. 20, 2019, 6 pages.
Notice of Allowance received for U.S. Appl. No. 15/719,244, dated Dec. 11, 2020, 11 pages.
Pre-Interview First Office Action received for U.S. Appl. No. 15/719,244, dated Jun. 13, 2019, 5 pages.
Balucani et al., "A New Approach: Low Cost Masking Material and Efficient Copper Metallization for Higher Efficiency Silicon Solar Cells", IEEE, 2015, 6 pages.
Fan et al., "Laser micromachined Wax-Covered Plastic Paper as both Sputter Deposition Shadow Masks and Deep-Ultraviolet Patterning Masks for Polymethylmacrylate-Based Microfluidic Systems", vol. 12, No. 4, Journal of Micro/ Nanolithography, MEMS, and MOEMS, Oct. 2013, pp. 1-6.
Pelisset et al., "Efficiency of Silicon Thin-Film Photovoltaic Modules with a Front Coloured Glass", Proceeding of the CISBAT International Conference, 2011, 6 pages.
Poole et al., "Recovery Act: Organic Coatings as Encapsulants for Low Cost, High Performance PV Modules", Final Technical Report, PPG Industries Inc., Nov. 16, 2011, 35 pages.
Vyas et al., "An Inorganic/Organic Hybrid Coating for Low Cost Metal Mounted Dye-Sensitized Solar Cells", 223rd ECS Meeting, The Electrochemical Society, 2013, 1 page.
Final Office Action received for U.S. Appl. No. 16/025,834, dated May 7, 2021, 18 pages.
Final Office Action received for U.S. Appl. No. 16/533,524, dated Apr. 15, 2021, 14 pages.
International Preliminary Report on Patentability received for PCT Patent Application No. PCT/US2020/044790, dated Feb. 17, 2022, 13 pages.
Office Action received for European Patent Application No. 18730466.2, dated Mar. 2, 2022, 6 pages.
Non-Final Office Action received for U.S. Appl. No. 16/533,524, dated Nov. 5, 2021, 10 pages.
Office Action received for Indian Patent Application No. 201947046252, dated Oct. 7, 2021, 8 pages.

* cited by examiner

GLASS COVER WITH OPTICAL-FILTERING COATING FOR MANAGING COLOR OF A SOLAR ROOF TILE

CROSS-REFERENCE TO RELATED APPLICATIONS

This application is a continuation of U.S. patent application Ser. No. 15/719,244, entitled "Glass Cover with Optical-Filtering Coating for Managing Color of a Solar Roof Tile," filed Sep. 28, 2017, the entire contents of which are incorporated herein by reference in their entirety.

FIELD OF THE INVENTION

This is generally related to solar roof tiles. More specifically, this is related to color management of solar roof tiles.

DEFINITIONS

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A photovoltaic structure may be divided into a number of strips. A strip may have any shape and any size. The width and length of a strip may be the same as or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a "string."

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

A "solar roof tile" refers to a solar module that not only is capable of generating electricity by absorbing sunlight but can also function as a conventional roof tile.

BACKGROUND

Advances in photovoltaic technology, which is used to make solar panels, have helped solar energy gain mass appeal among those wishing to reduce their carbon footprint and decrease their monthly energy costs. In the past decade, the number of residential homes equipped with solar panels has grown significantly. However, conventional rooftop solar panels often leave some portion of the roof uncovered, thus missing the opportunity to collect as much solar energy as possible. In addition, these conventional rooftop panels can be industrial-looking and often lack the curb appeal many homeowners desire.

Solar shingles or tiles, on the other hand, are solar modules that have similar appearances as conventional roof shingles or tiles. In addition to converting sunlight into electricity, the solar shingles or tiles also protect the roof from weather the same way traditional shingles or tiles do. They allow homeowners to turn their roof into an electricity generator while maintaining a conventional roofline.

A solar roof tile typically can include photovoltaic structures encapsulated between two covers. The top, sun-facing cover typically can be made of tempered glass. The transparency of the glass top cover can ensure sufficient absorption of the sunlight by the encapsulated photovoltaic structures. However, when viewed from a shallow angle (e.g., when the roof is viewed from the street), the photovoltaic structures, which can include dark colored Si substrates, can become visible. The color contrast between the photovoltaic structures and the glass cover can create a scene that is not aesthetically pleasing.

SUMMARY

One embodiment can provide a solar roof tile. The solar roof tile can include a front cover, a back cover, one or more photovoltaic structures positioned between the front cover and the back cover, and a band-stop optical filter positioned between the front cover and the photovoltaic structures. The band-stop optical filter is configured to block light within a predetermined spectral range, thereby preventing the light from reflecting off surfaces of the photovoltaic structures to exit the solar roof tile.

In a variation of the embodiment, a peak wavelength of a reflectivity spectrum of the photovoltaic structures falls within the predetermined spectral range.

In a variation of the embodiment, the predetermined spectral range is between 350 and 450 nm.

In a variation of the embodiment, the band-stop optical filter comprises an optical absorbing layer configured to absorb light within the predetermined spectral range.

In a further variation, the optical absorbing layer can include $Cu_2O$.

In a further variation, a thickness of the optical absorbing layer can be between 100 nm and 1000 nm.

In a further variation, the band-stop optical filter can further include a high reflection (HR) coating positioned on the optical absorbing layer, and the HR coating can be configured to have a high reflectivity within the predetermined spectral range.

In a further variation, the HR coating can include a transparent conductive oxide (TCO) layer.

In a further variation, the band-stop optical filter can further include one or more anti-reflection (AR) coatings, and the AR coatings can be configured to have a low reflectance over visible range.

In a further variation, the band-stop optical filter can include a $Cu_2O$ thin film, a first transparent conductive oxide (TCO) AR coating positioned on a first surface of the $Cu_2O$ thin film, and a second TCO AR coating on a second surface of the $Cu_2O$ thin film.

In a variation of the embodiment, the band-stop optical filter is positioned on a surface of the front cover that faces the photovoltaic structures.

In a further variation, the band-stop optical filter is deposited on the surface of the front cover using a physical vapor deposition technique.

In a variation of the embodiment, the back cover of the solar roof tile comprises polyethylene terephthalate (PET), fluoropolymer, polyvinyl fluoride (PVF), or polyamide.

In a further variation, a surface of the back cover that faces the photovoltaic structures can have a color that substantially matches that of the photovoltaic structures.

In a variation of the embodiment, the photovoltaic structures are arranged in a shingled manner to form a serially coupled string.

BRIEF DESCRIPTION OF THE FIGURES

In the figures, like reference numerals refer to the same figure elements.

DETAILED DESCRIPTION

Figure 1A:
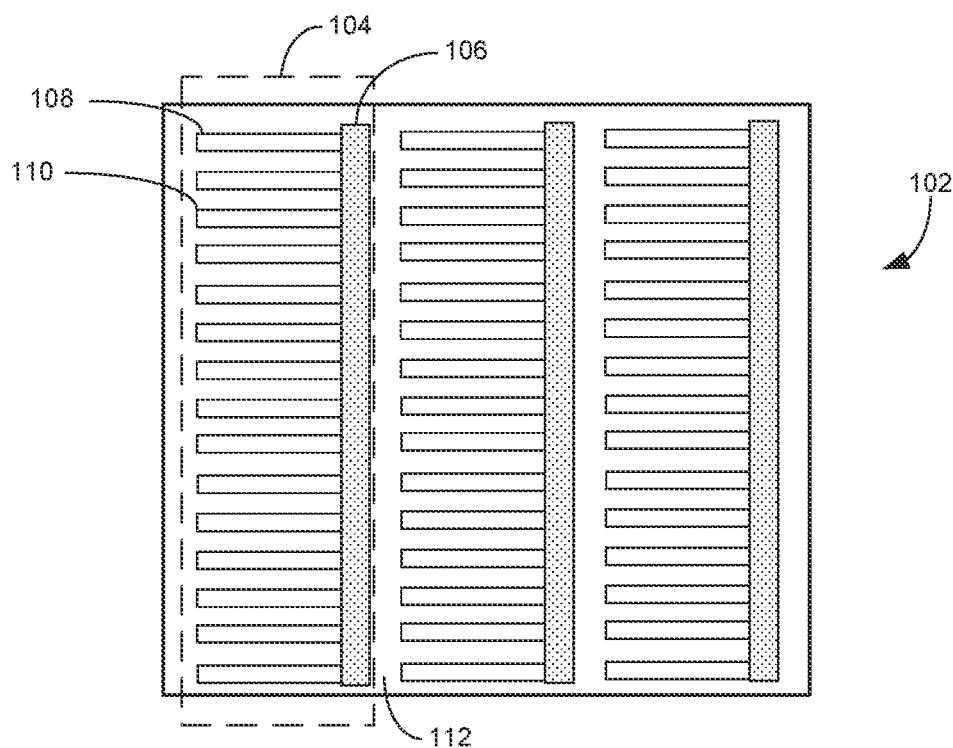
FIG. 1A shows an exemplary conductive grid pattern on the front surface of a photovoltaic structure.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the invention is not limited to the embodiments shown, but is to be accorded the widest scope consistent with the principles and features disclosed herein.

Overview

Embodiments of the invention provide a solution for the technical problem of color management of solar roof tiles. Cascaded photovoltaic strips can be sandwiched between a front glass cover and a back cover to form a solar roof tile. To obtain superior aesthetic effects, the solar roof tile can include a built-in band-stop optical filter positioned between the photovoltaic strips and the front glass cover. The optical filter can be configured to absorb/block blue or purple lights reflected from the surface of the photovoltaic structures while allowing the majority of the sunlight to pass through. The color of the back cover can also be carefully selected to match the color of light reflected from the surface of the photovoltaic structures. This way, photovoltaic structures encapsulated between the front and back covers can "blend in" with their surroundings, resulting in solar roof tiles with better aesthetics.

Solar Roof Tile with Cascaded Strips

As described in U.S. patent application Ser. No. 14/563,867, parallel connecting multiple (such as 3) strings of cascaded solar strips can provide a solar module with a reduced internal resistance. In general, a cell can be divided into a number of (e.g., n) strips, and a module can contain a number of parallel strings of cascaded strips (the number of strings can be the same as or different from the number of strips in the cell). If a string has the same number of strips as the number of undivided photovoltaic structures in a conventional single-string module, the string can output approximately the same voltage as the conventional module. Multiple strings can be connected in parallel to form a module. If the number of strings in the module is the same as the number of strips in the cell, the module can output roughly the same current as the conventional module. On the other hand, the module's total internal resistance can be a fraction (e.g., 1/n) of the resistance of a string. Therefore, in general, the greater n is, the lower the total internal resistance of the module, and the more power one can extract from the module. However, a tradeoff is that as n increases, the number of connections required to interconnect the strings also increases, which increases the amount of contact resistance. Also, the greater n is, the more strips a single cell needs to be divided into, which increases the associated production cost and decreases overall reliability due to the larger number of strips used in a single panel.

Another consideration in determining n is the contact resistance between the electrode and the photovoltaic structure on which the electrode is formed. The greater this contact resistance, the greater n might need to be to reduce effectively the panel's overall internal resistance. Hence, for a particular type of electrode, different values of n might be needed to attain sufficient benefit in reduced total panel internal resistance to offset the increased production cost and reduced reliability. For example, a conventional electrode based on silver-paste or aluminum may require n to be greater than 4, because the process of screen printing and firing silver paste onto a cell does not produce an ideal resistance between the electrode and the underlying photovoltaic structure. In some embodiments of the present invention, the electrodes, including both the busbars and finger lines, can be fabricated using a combination of physical vapor deposition (PVD) and electroplating of copper as an electrode material. The resulting copper electrode can exhibit lower resistance than an aluminum or screen-printed, silver-paste electrode. Consequently, a smaller n can be used to attain the benefit of reduced panel internal resistance. In some embodiments, n is selected to be three, which is less than the n value generally needed for cells with silver-paste electrodes or other types of electrodes. Correspondingly, two grooves can be scribed on a single cell to allow the cell to be divided into three strips.

In addition to lower contact resistance, electroplated copper electrodes can also offer better tolerance to microcracks, which may occur during a cleaving process. Such microcracks might adversely affect cells with silver-paste electrodes. Plated-copper electrodes, on the other hand, can preserve the conductivity across the cell surface even if there are microcracks in the photovoltaic structure. The copper electrode's higher tolerance for microcracks allows one to use thinner silicon wafers to manufacture cells. As a result, the grooves to be scribed on a cell can be shallower than the grooves scribed on a thicker wafer, which in turn helps increase the throughput of the scribing process. More details on using copper plating to form a low-resistance electrode on a photovoltaic structure are provided in U.S. patent application Ser. No. 12/835,670, entitled "SOLAR CELL WITH METAL GRID FABRICATED BY ELECTROPLATING," filed Jul. 13, 2010, and U.S. patent application Ser. No. 13/220,532, entitled "SOLAR CELL WITH ELECTROPLATED GRID," filed Aug. 29, 2011, the disclosures of which are incorporated herein by reference in its entirety.

FIG. 1A shows an exemplary grid pattern on the front surface of a photovoltaic structure, according to one embodiment of the present invention. In the example shown in FIG. 1A, grid 102 includes three sub-grids, such as sub-grid 104. This three sub-grid configuration allows the photovoltaic structure to be divided into three strips. To enable cascading, each sub-grid needs to have an edge busbar, which can be located either at or near the edge. In the example shown in FIG. 1A, each sub-grid includes an edge busbar ("edge" here refers to the edge of a respective strip) running along the longer edge of the corresponding strip and a plurality of parallel finger lines running in a direction parallel to the shorter edge of the strip. For example, sub-grid 104 can include edge busbar 106, and a plurality of finger lines, such as finger lines 108 and 110. To facilitate the subsequent laser-assisted scribe-and-cleave process, a predefined blank space (i.e., space not covered by electrodes) is inserted between the adjacent sub-grids. For example, blank space 112 is defined to separate sub-grid 104 from its adjacent sub-grid. In some embodiments, the width of the blank space, such as blank space 112, can be between 0.1 mm and 5 mm, preferably between 0.5 mm and 2 mm. There is a tradeoff between a wider space that leads to a more tolerant scribing operation and a narrower space that leads to more effective current collection. In a further embodiment, the width of such a blank space can be approximately 1 mm.

Figure 1B:
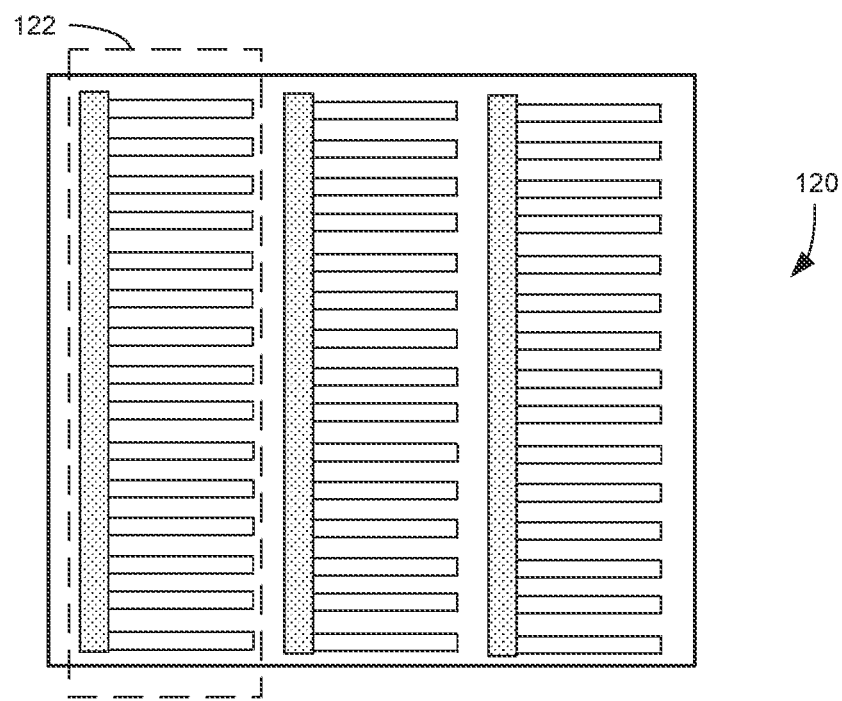
FIG. 1B shows an exemplary conductive grid pattern on the back surface of a photovoltaic structure.

FIG. 1B shows an exemplary grid pattern on the back surface of a photovoltaic structure, according to one embodiment of the invention. In the example shown in FIG. 1B, back grid 120 can include three sub-grids, such as sub-grid 122. To enable cascaded and bifacial operation, the back sub-grid may correspond to the front sub-grid. More specifically, the back edge busbar needs to be located near the opposite edge of the frontside edge busbar. In the examples shown in FIGS. 1A and 1B, the front and back sub-grids have similar patterns except that the front and back edge busbars are located adjacent to opposite edges of the strip. In addition, locations of the blank spaces in back conductive grid 120 correspond to locations of the blank spaces in front conductive grid 102, such that the grid lines do not interfere with the subsequent scribe-and-cleave process. In practice, the finger line patterns on the front and back side of the photovoltaic structure may be the same or different.

In the examples shown in FIGS. 1A and 1B, the finger line patterns can include continuous, non-broken loops. For example, as shown in FIG. 1A, finger lines 108 and 110 both include connected loops with rounded corners. This type of "looped" finger line pattern can reduce the likelihood of the finger lines peeling away from the photovoltaic structure after a long period of usage. Optionally, the sections where parallel lines are joined can be wider than the rest of the finger lines to provide more durability and prevent peeling. Patterns other than the one shown in FIGS. 1A and 1B, such as un-looped straight lines or loops with different shapes, are also possible.

Figure 2A:
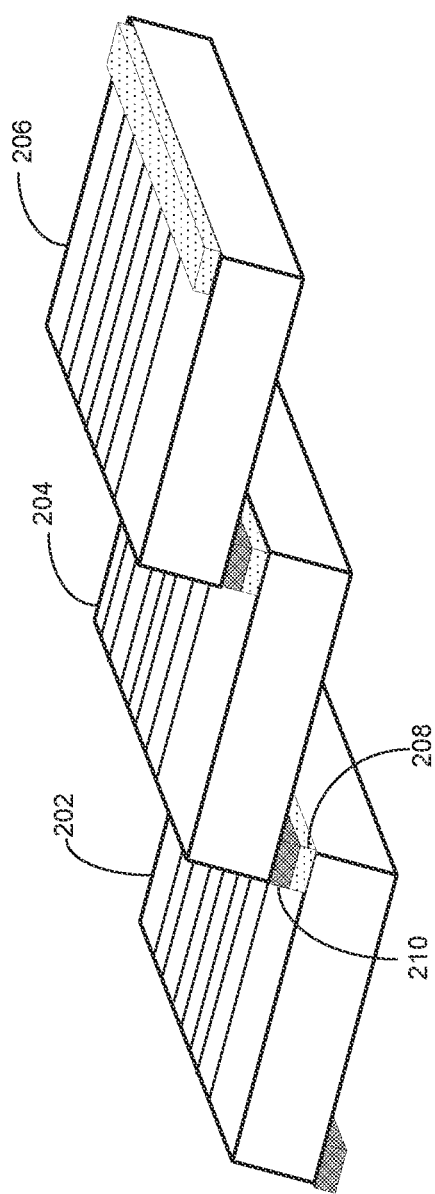
FIG. 2A shows a string of strips stacked in a cascaded pattern.

To form a cascaded string, cells or strips (e.g., as a result of a scribing-and-cleaving process applied to a regular square cell) can be cascaded with their edges overlapped. FIG. 2A shows a string of cascaded strips, according to an embodiment of the invention. In FIG. 2A, strips 202, 204, and 206 are stacked in such a way that strip 206 partially overlaps adjacent strip 204, which also partially overlaps (on an opposite edge) strip 202. Such a string of strips forms a pattern that is similar to roof shingles. Each strip includes top and bottom edge busbars located at opposite edges of the top and bottom surfaces, respectively. Strips 202 and 204 are coupled to each other via an edge busbar 208 located at the top surface of strip 202 and an edge busbar 210 located at the bottom surface of strip 204. To establish electrical coupling, strips 202 and 204 are placed in such a way that bottom edge busbar 210 is placed on top of and in direct contact with top edge busbar 208.

Figure 2B:
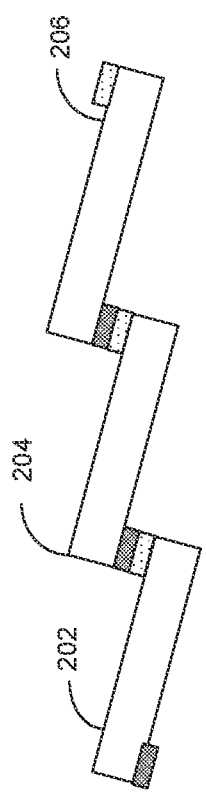
FIG. 2B shows the side view of the string of cascaded strips.

FIG. 2B shows a side view of the string of cascaded strips, according to one embodiment of the invention. In the example shown in FIGS. 2A and 2B, the strips can be part of a six-inch square or pseudo-square photovoltaic structure, with each strip having a dimension of approximately two inches by six inches. To reduce shading, the overlapping between adjacent strips should be kept as small as possible. In some embodiments, the single busbars (both at the top and the bottom surfaces) are placed at the very edge of the strip (as shown in FIGS. 2A and 2B). The same cascaded pattern can extend along an entire row of strips to form a serially connected string.

Figure 3A:
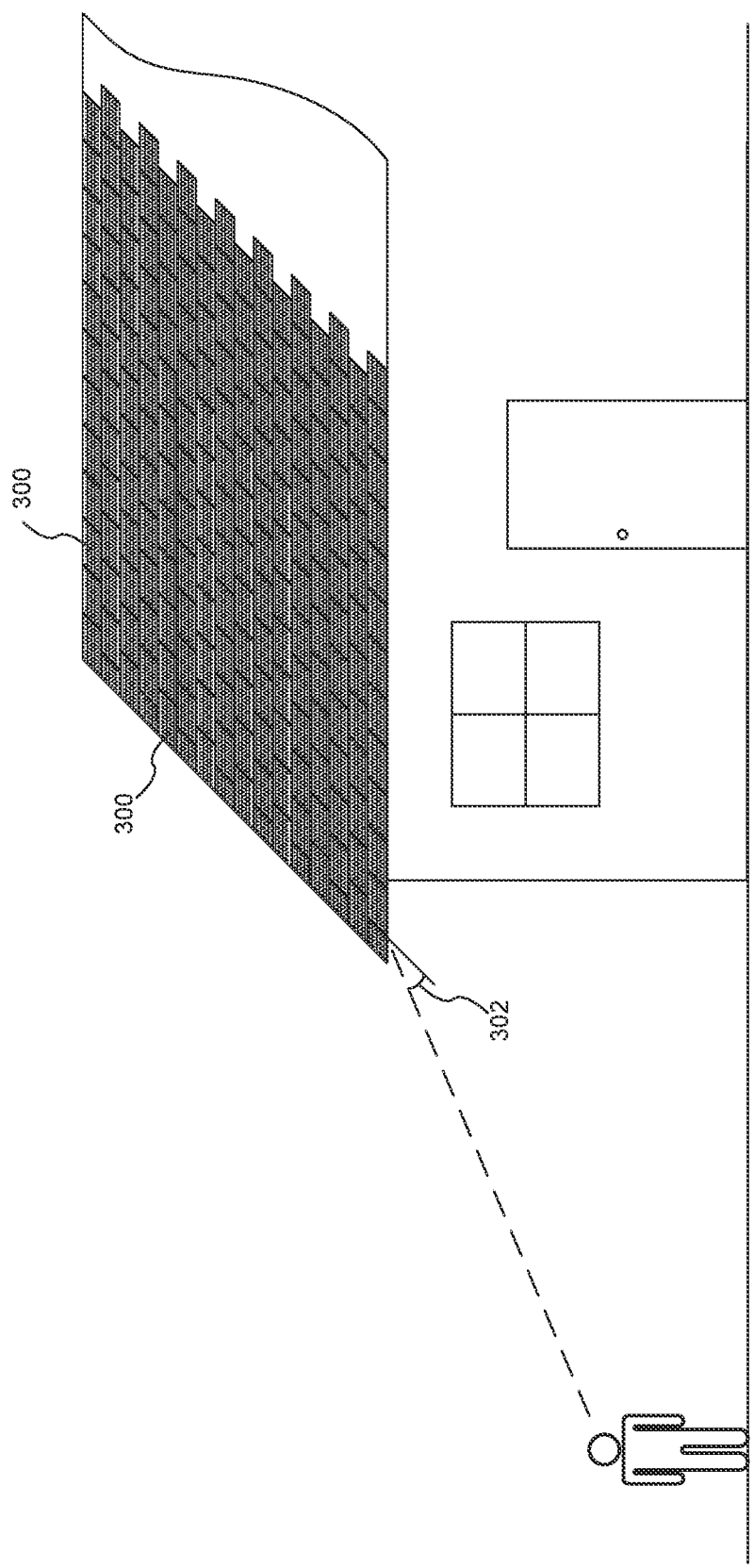
FIG. 3A shows an exemplary configuration of solar roof tiles on a house, according to an embodiment of the present invention.

FIG. 3A shows an exemplary configuration of solar roof tiles on a house, according to an embodiment of the present invention. In this example, solar roof tiles 300 can be installed on a house like conventional roof tiles or shingles, and can provide the functions of conventional roof tiles as well as solar cells. Particularly, a solar roof tile can be placed along with other tiles in such a way as to prevent water leakage. At the same time, electrical connections can be made between two adjacent tiles to interconnect multiple tiles into a module, so that a number of solar roof tiles can jointly provide electrical power. FIG. 3A also shows the relative viewing angle 302 of a person on the street viewing a roof tile. One can see that viewing angle 302 can be relatively small.

Figure 3B:
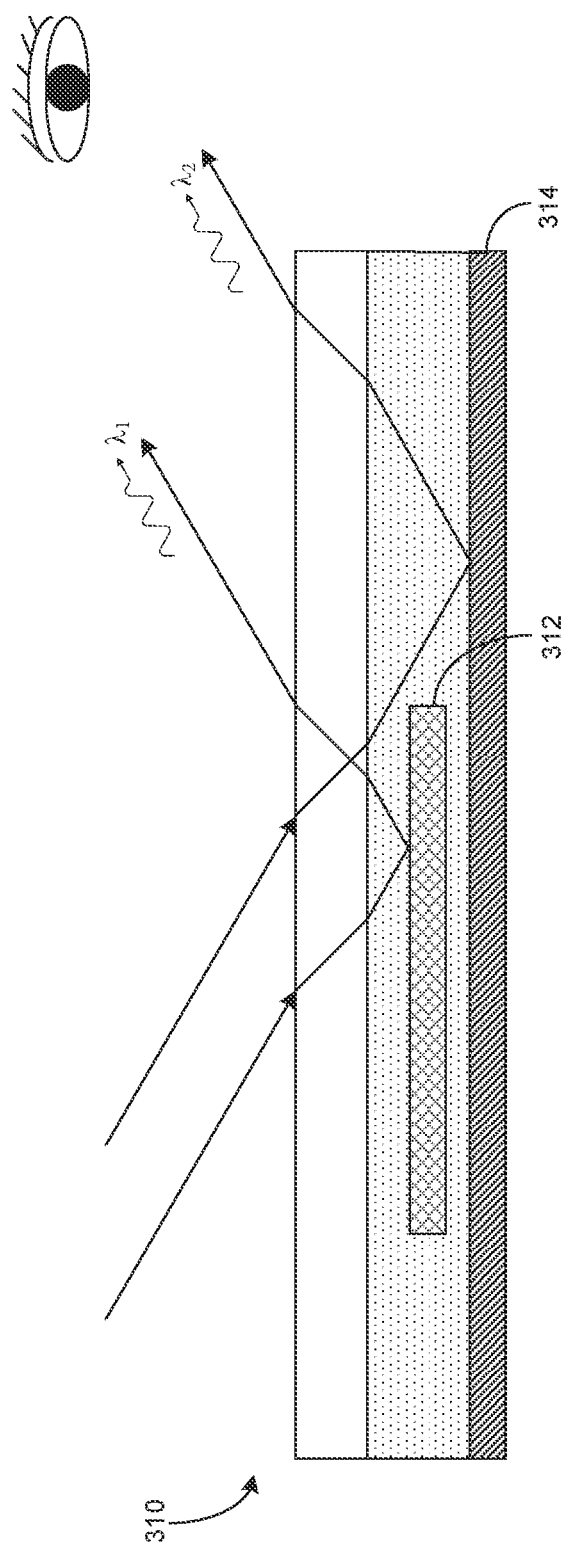
FIG. 3B shows the concept of light reflected from a solar roof tile into a viewer's eye.

FIG. 3B shows the concept of light reflected from a solar roof tile into a viewer's eye. As shown in FIG. 3B, when sunlight shines onto solar roof tile 310, a portion of the light is reflected off the surface of encapsulated photovoltaic structure 312, and a portion of the light is reflected off the surface of back cover 314. Back cover 314 can be made of glass or other non-transparent materials that can be used to form a backsheet of a solar module. For example, a backsheet can include polyethylene terephthalate (PET), fluoropolymer, polyvinyl fluoride (PVF), polyamide, etc. Certain types of backsheet may also include an embedded metal layer (e.g., a layer of Al) for moisture-resistance purposes. In conventional solar panels, the backsheet may have a white surface facing the sun. However, for solar roof tile applications, the backsheet may have a dark (e.g., black) surface, meaning that it may absorb most light. On the other hand, depending on the design, Si-based photovoltaic structure 312 typically can reflect purple or blue light. The spectral difference of optical reflectivity between photovoltaic structure 312 and back cover 314 can result in the different portions of the reflected light having different colors. Hence, when a user is viewing a solar roof tile, he can see the color contrast between photovoltaic structure 312 and back cover 314.

Figure 3C:
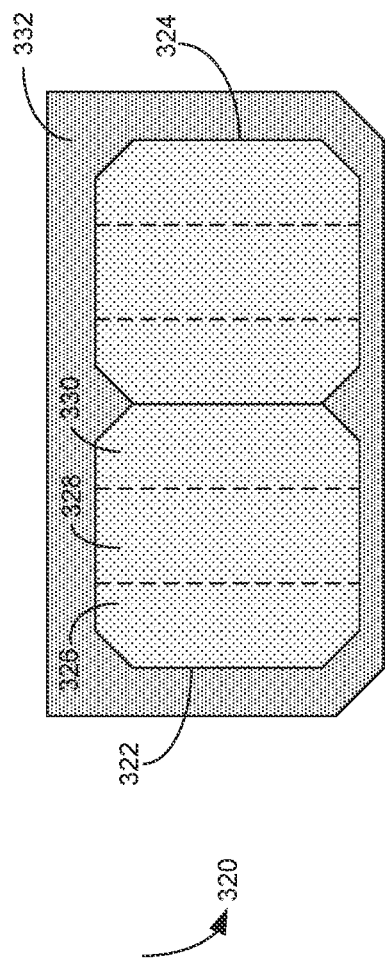
FIG. 3C shows the appearance of an exemplary solar roof tile, according to one embodiment.

FIG. 3C shows the appearance of an exemplary solar roof tile, according to one embodiment. In FIG. 3C, it is assumed that the top glass cover of solar roof tile 320 is transparent. Solar roof tile 320 can include solar cells 322 and 324, which can be conventional square or pseudo-square solar cells, such as six-inch solar cells. In some embodiments, solar cells 322 and 324 can each be divided into three separate pieces of similar or different sizes. For example, solar cell 322 can include strips 326, 328, and 330. These strips can be arranged in such a way that adjacent strips partially overlap at the edges, similar to the ones shown in FIGS. 2A-2B. For simplicity of illustration, the electrode grids, including the finger lines and edge busbars, of the strips are not shown in FIG. 3C. The interfaces between adjacent strips are shown in FIG. 3C using dashed lines. In practice, these interfaces can be difficult to see. However, due to the spectral difference of optical reflectivity between the solar cells and back cover 332, solar cells 322 and 324 can be visible against back cover 332.

Figure 3D:
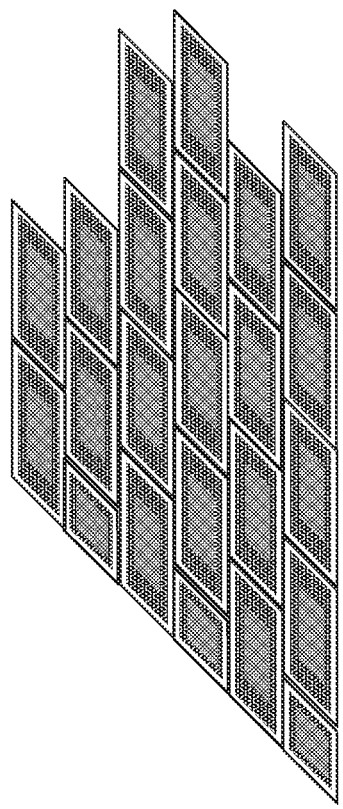
FIG. 3D shows a partial roof with solar roof tiles, according to one embodiment.

FIG. 3D shows a partial roof with solar roof tiles, according to one embodiment. One can see that the profiles of photovoltaic structures can be seen against the dark colored or black backsheet. Such a roof cannot provide sufficient curb appeal desired by homeowners. To hide the photovoltaic structures or to have the photovoltaic structures blend in with the surrounding environment (e.g., the backsheet and the encapsulant), in some embodiments, a band-stop optical filtering structure can be inserted between the front cover and the photovoltaic structures. The optical filtering structure can absorb/block light reflected off the surface of the photovoltaic structures, thus causing the photovoltaic structures to blend in with the black backsheet.

Optical Filter on the Front Cover

Figure 4A:
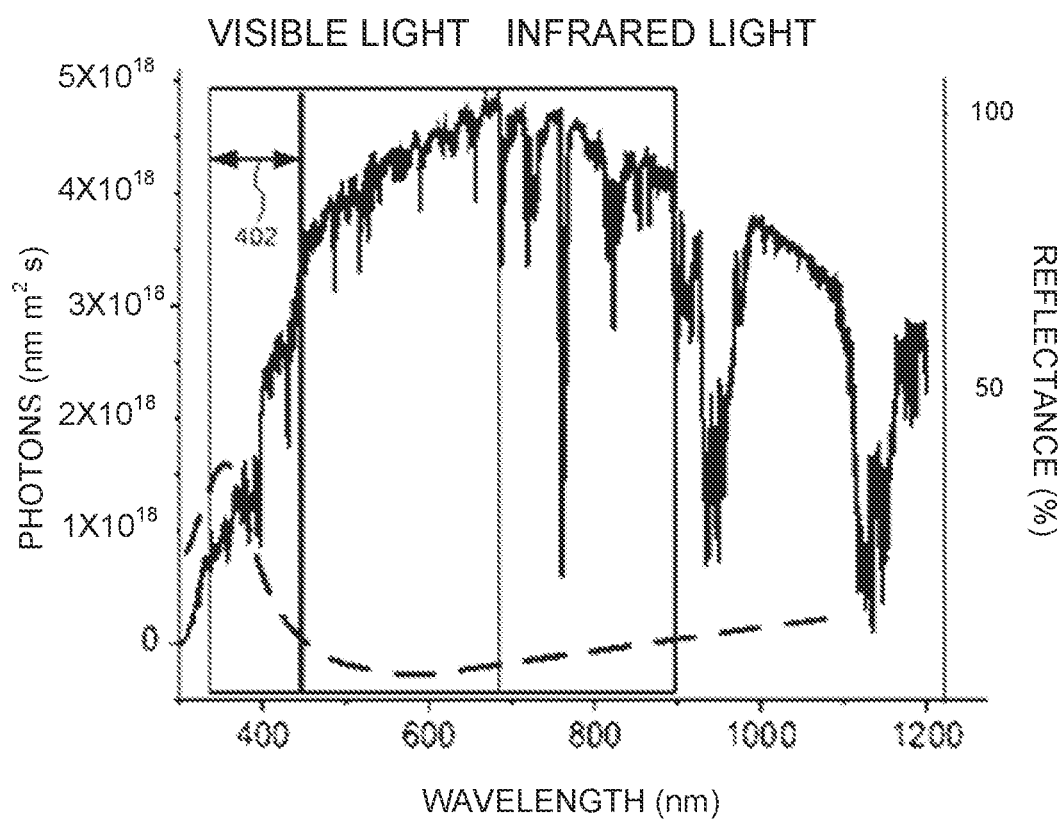
FIG. 4A shows the spectral irradiance of sunlight as a function of wavelength and the reflectivity spectrum of typical photovoltaic structures.

FIG. 4A shows the spectral irradiance of sunlight as a function of wavelength and the reflectivity spectrum of typical photovoltaic structures. In FIG. 4A, the solid curve shows the spectral irradiance of sunlight and the dashed curve shows the reflectivity of the photovoltaic structures. To ensure high solar cell efficiency, the reflectivity of the photovoltaic structures is designed to peak at the spectral edge of the visible light, e.g., at around 350 nm. Hence, to reduce the amount of light reflected off the photovoltaic structures in order to "hide" the photovoltaic structures, a spectral block element (e.g., a band-stop/block optical filter) can be included in the solar roof tile. More specifically, the spectral block element can take effect in the short-wavelength range (e.g., between 350 and 450 nm), as shown by double arrow 402. Sunlight within this spectral range can be absorbed/blocked from exiting the solar roof tile. As a result, the photovoltaic structure can appear to be "invisible." Note that, because the photon density of the sunlight within the blocked spectral range is relatively low, the impact to the solar cell efficiency caused by including the spectral block element into the solar roof tile can be relatively small.

In some embodiments, the spectral block element can include a band-stop optical filter, which can include a semiconducting material that can absorb light having wavelengths around the peak of the reflection spectrum of the photovoltaic structures. This way, light reflected from the surface of the photovoltaic structures can be absorbed by the optical filter and will not transmit outside of the solar roof tile. For example, cuprous oxide ($Cu_2O$) has a band gap at around 2.5 eV, which means it can absorb light with a wavelength shorter than 500 nm. On the other hand, FIG. 4A shows that the photovoltaic structures can have a reflection spectrum that peaks at a wavelength below 400 nm. Hence, an optical filter made of a thin layer of $Cu_2O$ can effectively absorb the blue/purple light reflected off the surface of the photovoltaic structures, thus preventing the reflected light from exiting the solar roof tile. In addition to $Cu_2O$, other semiconductor materials having a small band gap in a range between 2 and 2.5 eV can also be used to form the optical filter.

Figure 4B:
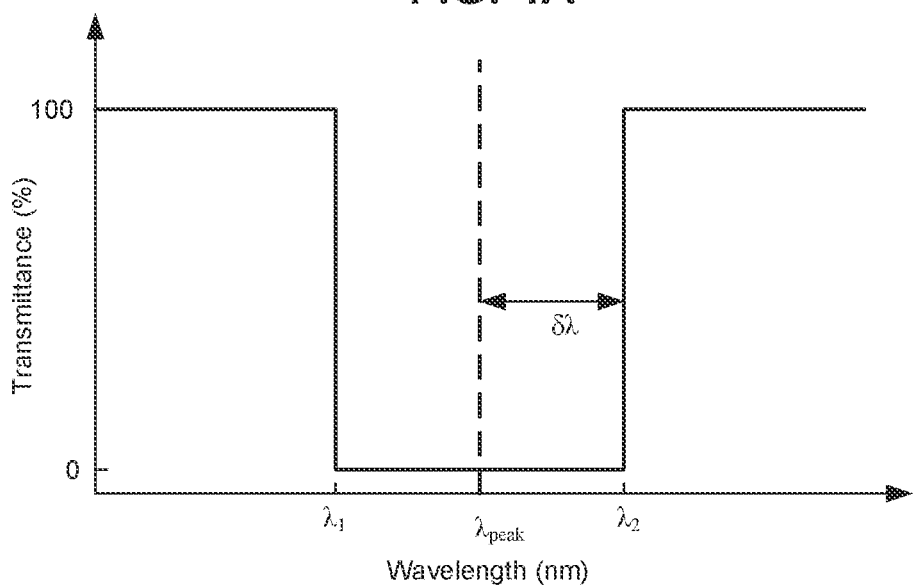
FIG. 4B shows the transmittance diagram of an exemplary band-stop optical filter, according to one embodiment.

FIG. 4B shows the transmittance diagram of an exemplary band-stop optical filter, according to one embodiment. For simplicity, the transmittance diagram shows the transmittance of an ideal filter. The transmittance of a practical filter can be somewhat different. In FIG. 4B, the transmittance of the band-stop filter is 100%, except in the spectral range between $\lambda 1$ and $\lambda 2$, where the transmittance of the filter is reduced to zero. In other words, light with a wavelength between $\lambda 1$ and $\lambda 2$ will be blocked by the optical filter.

FIG. 4B also shows the location of the peak wavelength ($\lambda peak$) of the reflectivity spectrum of the photovoltaic structures. To effectively "hide" the photovoltaic structures (e.g., to block light reflected off the photovoltaic structures), one may wish to design the optical filter in a way such that $\lambda peak$ falls inside the blocked band. In some embodiments, one can design the optical filter such that $\lambda peak$ is close to the center wavelength of the blocked band. The bandwidth of the blocked band can also be chosen to increase the camouflage effect without significantly reducing the energy efficiency of those photovoltaic structures. In some embodiments, $\delta\lambda$ (the difference between $\lambda 2$ and $\lambda peak$) can be set between 20 and 100 nm. In one embodiment, $\delta\lambda$ can be designed to be 50 nm. Note that, considering that $\lambda peak$ can be close to the edge of the visible spectral range, the location of the lower band edge $\lambda 1$ is less important, because it is most likely outside of the visible range. However, if the photovoltaic structures are designed such that $\lambda peak$ is not close to the edge of the visible spectral range, one may need to ensure a reasonable spectral distance (e.g., between 20 and 100 nm) between $\lambda 1$ and $\lambda peak$.

Figure 5A:
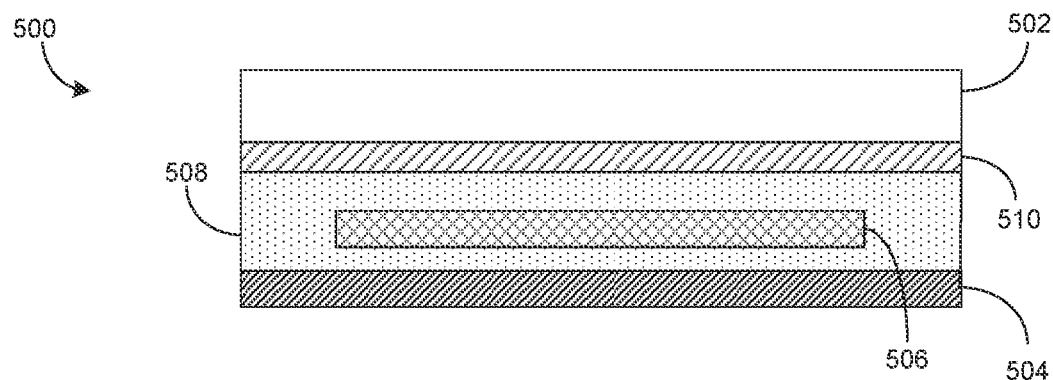
FIG. 5A shows the structure of an exemplary solar roof tile, according to one embodiment.

In some embodiments, the band-stop optical filter can be implemented using an optical absorber alone. Furthermore, the absorber-based optical filter can take the form of a thin film deposited onto the front cover. FIG. 5A shows the structure of an exemplary solar roof tile, according to one embodiment. Solar roof tile 500 can include front cover 502, backsheet 504, one or more photovoltaic structures 506, encapsulant 508 that encapsulates photovoltaic structures 506 between front cover 502 and backsheet 504, and optical absorbing layer 510.

As discussed previously, front cover 502 can be made of tempered glass and backsheet 504 can be made of a wide variety of materials, including but not limited to: PET, PVF, polyamide, aluminum, etc. Note that, as seen in FIG. 3C, contrary to conventional solar panels where the solar cells may substantially cover the entire surface of the backsheet, the backsheet of a solar roof tile may have a considerable portion that is exposed. This is because additional space is needed to allow for mechanical and electrical coupling between adjacent tiles. More details about solar roof tile packaging can be found in U.S. patent application Ser. No. 15/656,794, entitled "PACKAGING FOR SOLAR ROOF TILES," filed Jul. 21, 2017, the disclosure of which is incorporated herein by reference in its entirety. The color of the sun-facing surface of backsheet 504 can be chosen based on design needs. In some embodiments, the sun-facing surface of backsheet 504 can be black. In some embodiments, the color of the sun-facing surface of backsheet 504 can match that of photovoltaic structures 506 to allow photovoltaic structures 506 to blend in with the surrounding environment.

Photovoltaic structures 506 can include a number of electrically coupled, either in series or in parallel, photovoltaic strips. In some embodiments, photovoltaic structures 506 can include a plurality of cascaded strips, which are arranged in a way similar to the ones shown in FIGS. 2A-2B. A respective photovoltaic strip typically can include a base layer, an emitter and a surface field layer on each side of the base layer, a transparent conductive oxide (TCO) layer on the emitter, and a TCO layer on the surface field layer. In some embodiments, a quantum tunneling barrier (QTB) layer (e.g., a thin layer of SiOx) can also be deposited on both surfaces of the base layer in order to enhance the efficiency of the photovoltaic strip. Details, including fabrication methods, about the photovoltaic strips can be found in U.S. Pat. No. 8,686,283, entitled "Solar Cell with Oxide Tunneling Junctions," filed Nov. 12, 2010, the disclosure of which is incorporated by reference in its entirety herein.

The TCO layer on the front surface of the photovoltaic structure can serve both as an ohmic contact and an anti-reflection (AR) layer. Moreover, the thickness of this TCO layer can be tuned to maximize the light absorbed by the photovoltaic structure. In some embodiments, to maximize absorption of the sunlight, the TCO layer on the sun-facing side of the photovoltaic structure can have a thickness that is approximately 700 nm. This can cause the front surface of the photovoltaic structure to mostly reflect light with shorter wavelengths (e.g., blue or purple light), thus appearing to be blue or purple colored.

Encapsulant 508 can include EVA (ethyl vinyl acetate), which can be designed to be transparent (or mostly transparent) to the entire spectrum of visible light.

Optical absorbing layer 510 can include a thin film deposited onto front cover 502. In some embodiments, optical absorbing layer 510 can include a Cu2O thin film that is deposited onto front cover 502 using a physical vapor deposition (PVD) technique, such as evaporation or sputtering. The thickness of optical absorbing layer 510 can be between 100 nm and 1000 nm. A thicker film can increase absorption of the blue/purple light, thus facilitating better camouflaging of the photovoltaic structures. However, a thicker film may also reduce the amount of light absorbed by the photovoltaic structures, thus reducing the energy efficiency of the solar roof tile.

In addition to being able to absorb the short-wavelength light, the Cu2O layer can also strongly reflect the short-wavelength light due to its high refractive index at those wavelengths. This means that only a very small portion of the blue component of sunlight will be able to reach and be reflected by the surface of the photovoltaic structures. The combination of reflection and absorption of the short-wavelength light can ensure that the photovoltaic structures will have a similar appearance as their surroundings. More specifically, because optical absorbing layer 510 reflects the blue/purple light, the entire solar roof tile may appear blue/purple.

To further reduce the amount of short-wavelength light that may reach the surface of the photovoltaic structures and transmit outside of the solar roof tile, in some embodiments, in addition to the optical absorbing layer, the optical filter deposited onto the front cover can include one or more high-reflection (HR) layers designed to have high reflectivity for shorter-wavelength light. More specifically, the HR layers can be designed to be highly reflective of the blue or purple light or have a high refractive index at short wavelengths.

Figure 5B:
FIG. 5B shows an exemplary optical filter with both an optical absorbing layer and a high-reflection layer, according to one embodiment.

FIG. 5B shows an exemplary optical filter with both an optical absorbing layer and a high-reflection layer, according to one embodiment. Optical filter 520 can include optical absorbing layer 522 and HR layer 524. Optical absorbing layer 522 can be similar to optical absorbing layer 510 shown in FIG. 5A and can include a thin Cu2O film. HR layer 524 can include one or more layers of TCO, such as indium tin oxide (ITO) or aluminum-doped zinc oxide (AZO). In some embodiments, the thickness of HR layer 524 can be between 150 nm and 250 nm to ensure high reflectivity of the blue and purple light. Various deposition techniques can be used to deposit HR layer 524. In some embodiments, a PVD technique, such as evaporation or sputtering, can be used to deposit HR layer 524. Because HR layer 524 is deposited on the front (or sun-facing) side of optical absorbing layer 522, it can prevent short-wavelength light (e.g., blue or purple light) from reaching the surface of the photovoltaic structures. Even if a small amount of blue/purple light does pass through HR layer 524, such light will be absorbed by optical absorbing layer 522.

Figure 5C:
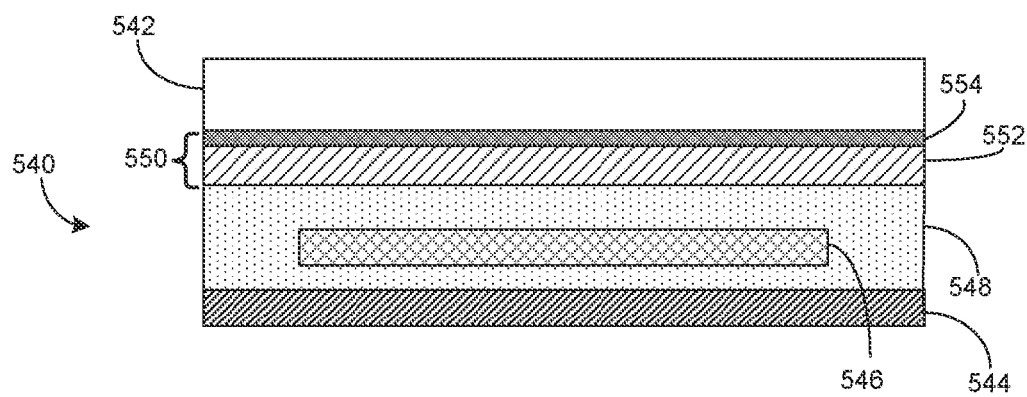
FIG. 5C shows the structure of an exemplary solar roof tile, according to one embodiment.

FIG. 5C shows the structure of an exemplary solar roof tile, according to one embodiment. Solar roof tile 540 can include front cover 542, backsheet 544, one or more photovoltaic structures 546, encapsulant 548, and optical filter 550. Front cover 542, backsheet 544, photovoltaic structures 546, and encapsulant 548 can be similar, respectively, to front cover 502, backsheet 504, photovoltaic structures 506, and encapsulant 508 shown in FIG. 5A. Optical filter 550 can include a multilayer film stack that is similar to optical filter 520 shown in FIG. 5B. In some embodiments, optical filter 550 can include Cu2O thin film 552 and ITO layer 554. The multilayer film stack can be deposited onto front cover 542 sequentially using a PVD technique.

In addition to the single layer HR structure 524 shown in FIG. 5B, in some embodiments, an HR structure may include multiple layers of films. For example, an HR structure can include a layer of high-index material (e.g., TiO2, ITO, or IZO) and a layer of low-index material (e.g., SiO2 or MgF2). In fact, by arranging the high-index material and the low-index material into a periodic layer stack, a band-stop effect can be achieved. By designing the thickness of the layers, short-wavelength light, such as blue or purple light, can be effectively blocked from reaching the surface of the photovoltaic structures.

In some embodiments, HR layer 524 or 554 may also be designed in such a way that the solar roof tile may have a desired appearance. For example, if HR layer 554 includes ITO, the thickness of the ITO layer may be tuned such that it reflects light of a particular color or color pattern.

The spectral block element based on both reflection and absorption mechanisms can effectively prevent light reflecting off the surface of photovoltaic structures from exiting the solar roof tile. To minimize the impact on solar cell efficiency by the spectral block element, in some embodiments, a spectral block element that is based on the absorption mechanism only can be used in solar roof tiles. More specifically, anti-reflection (AR) coatings can be applied onto the optical absorbing layer to maximize the amount of light that can be absorbed by the photovoltaic structures.

Figure 6A:
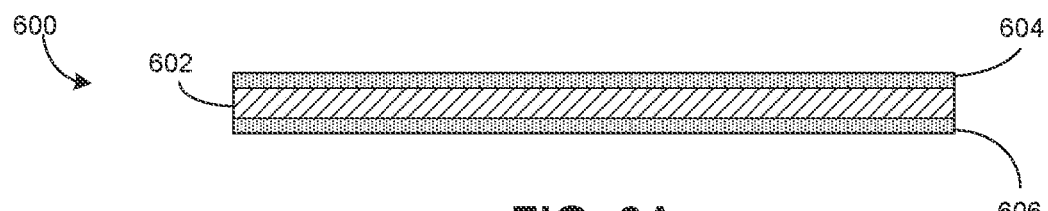
FIG. 6A shows an exemplary optical filter with an optical absorbing layer and one or more anti-reflection layers, according to one embodiment.

FIG. 6A shows an exemplary optical filter with an optical absorbing layer and one or more anti-reflection layers, according to one embodiment. Optical filter 600 can include optical absorbing layer 602 and AR layers 604 and 606. Optical absorbing layer 602 can include a thin Cu2O film. AR layers 604 and 606 can include one or more layers of TCO, such as ITO or AZO. In some embodiments, AR layers 604 and 606 can be designed to ensure very low reflectance across the visible range at glancing or gazing angles. For example, each of the AR layers may include multiple film layers having different optical properties to achieve low reflectance across a broader spectral range. In some embodiments, the thickness of an ITO-based AR layer can be between 200 nm and 400 nm.

Figure 6B:
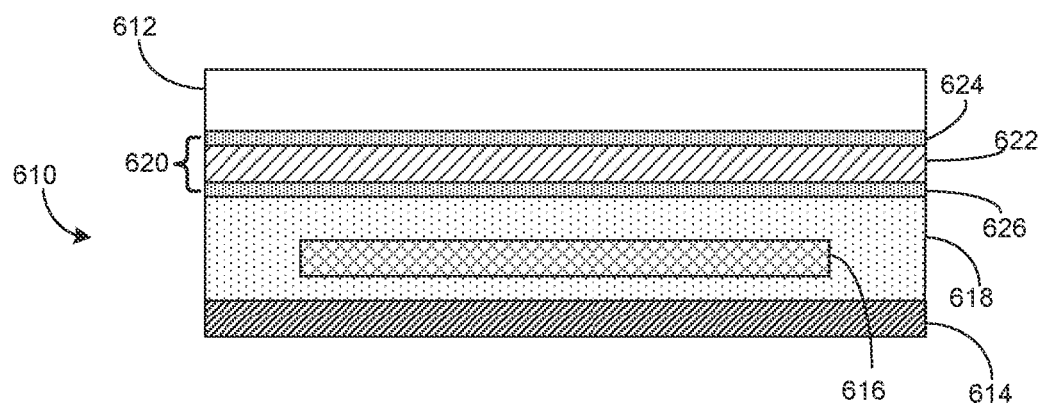
FIG. 6B shows the structure of an exemplary solar roof tile, according to one embodiment.

FIG. 6B shows the structure of an exemplary solar roof tile, according to one embodiment. Solar roof tile 610 can include front cover 612, backsheet 614, one or more photovoltaic structures 616, encapsulant 618, and optical filter 620. Front cover 612, backsheet 614, photovoltaic structures 616, and encapsulant 618 can be similar, respectively, to front cover 502, backsheet 504, photovoltaic structures 506, and encapsulant 508 shown in FIG. 5A. Optical filter 620 can include a multilayer film stack that is similar to optical filter 600 shown in FIG. 6A. In some embodiments, optical filter 620 can include Cu2O thin film 622 and ITO layers 624 and 626. The multilayer film stack can be deposited onto front cover 612 sequentially using a PVD technique.

Figure 6C:
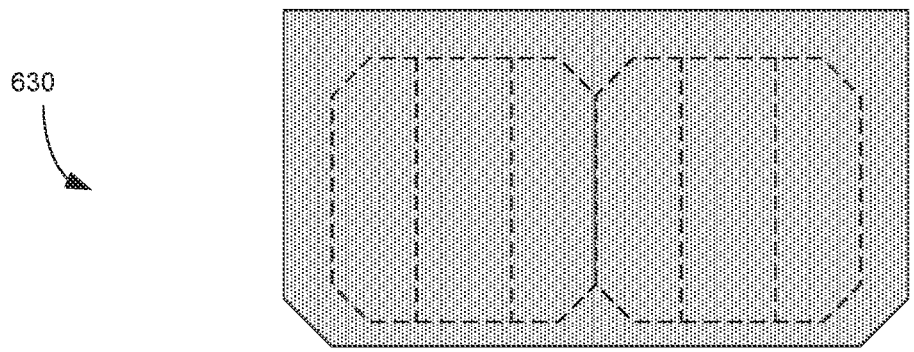
FIG. 6C shows the appearance of an exemplary solar roof tile, according to one embodiment.

FIG. 6C shows the appearance of an exemplary solar roof tile, according to one embodiment. In FIG. 6C, solar roof tile 630 appears to be uniformly colored. The dashed lines show the locations of the photovoltaic strips and are, in fact, invisible to observers. In some embodiments, the optical filter deposited onto the front glass cover can be similar to the ones shown in FIG. 5A and FIG. 5B. In such scenarios, due to reflection of the short-wavelength light, the surface of solar roof tile 630 can appear to be blue or purple. In alternative embodiments, the optical filter deposited onto the front glass cover can be similar to the one shown in FIG. 6A. In this scenario, due to the absence of reflection, the surface of solar roof tile 630 can appear black.

Figure 7A:
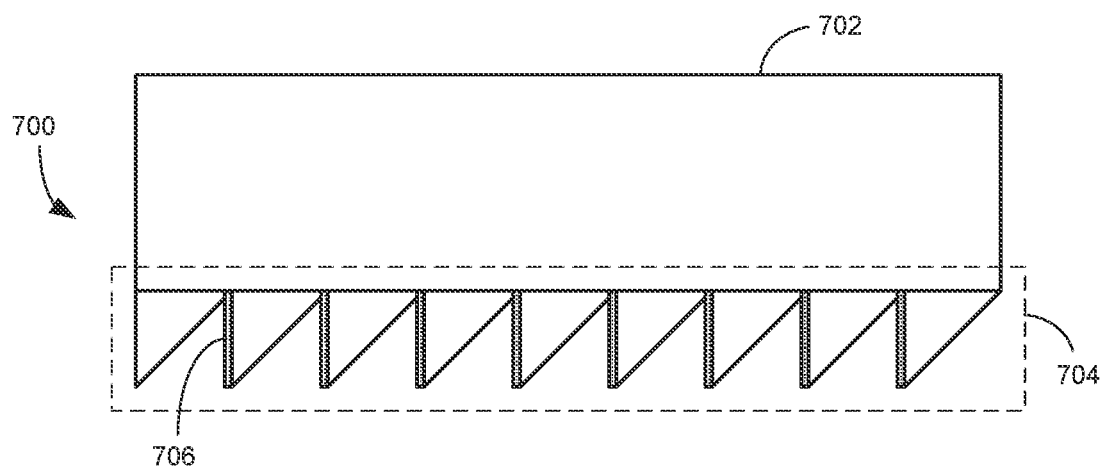
FIG. 7A shows an exemplary front cover with a textured surface, according to one embodiment.

The spectral block element can take other forms. For example, the spectral block element can be arranged into a louver format to achieve the spectral-blocking effect in a particular direction. FIG. 7A shows an exemplary front cover with a textured surface, according to one embodiment. In FIG. 7A, front cover 700 of a solar roof tile can include flat sun-facing surface 702 and textured back surface 704 that faces photovoltaic structures. Textured back surface 704 can include an array of three-dimensional (3D) features, and each of the 3D features can have a feature size ranging from 10 μm to 5 mm. In the example shown in FIG. 7A, the 3D features can be arranged to form a louver, with each 3D feature having a substantially vertical surface. In some embodiments, textured back surface 704 can be manufactured using a texture roller process and/or a chemical etching process followed by a tempering process. Alternatively, textured back surface 704 can be formed by laminating a louver film onto the back surface of glass cover 700.

To implement the spectral block element, in some embodiments, a directional thin film deposition technique, such as a PVD technique, can be used to coat textured back surface 704. More specifically, optical filters (e.g., optical filter 706) can be directionally deposited onto the substantially vertical surface of the 3D features, forming a louver pattern. The optical filters can be similar to optical filter 510 shown in FIG. 5A, optical filter 520 shown in FIG. 5B, or optical filter 600 shown in FIG. 6A. This way, short-wavelength light will be absorbed or blocked when viewed at glancing or gazing angles. As a result, when an observer is viewing the solar roof tile at glancing or gazing angles, the encapsulated photovoltaic strips are not visible.

Figure 7B:
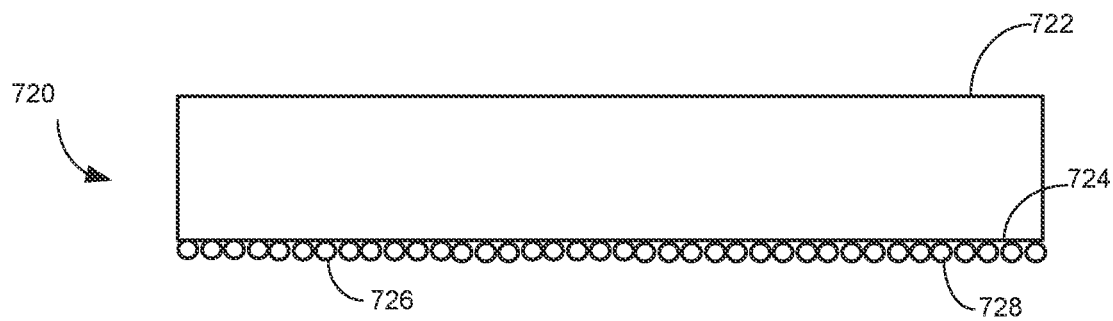
FIG. 7B shows an exemplary front cover, according to one embodiment.

In some embodiments, nanoparticles that can absorb or reflect the short-wavelength light can be used to form the spectral block element. FIG. 7B shows an exemplary front cover, according to one embodiment. In FIG. 7B, front cover 720 of a solar roof tile can include flat sun-facing surface 722 and back surface 724. Back surface 724 faces the photovoltaic structures encapsulated within the solar roof tile and can be covered with a layer of nanoparticles, such as nanoparticles 726 and 728. The size of these nanoparticles can be designed such that they can effectively reflect/scatter short-wavelength light. In some embodiments, back surface 724 can be deposited with a layer of Ag particles having a diameter around 75 nm. In addition to Ag particles, Cu2O nanoparticles that can both absorb and scatter the short-wavelength light can also be deposited onto back surface 724.

Figure 7C:
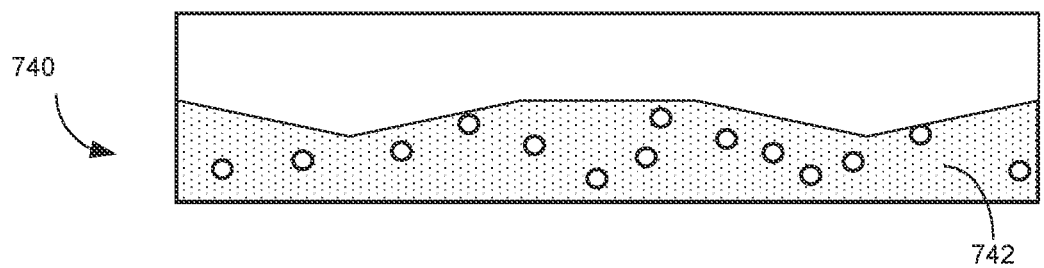
FIG. 7C shows an exemplary front cover, according to one embodiment.

Other than depositing nanoparticles directly onto the back surface of the front cover of the solar roof tile to obtain the spectral blocking effect, it is also possible to embed nanoparticles into a thin film and then apply such thin film onto the back surface, as shown in FIG. 7C. In FIG. 7C, a plurality of nanoparticles can be embedded in thin film 742, which is deposited onto the back surface of front cover 740. In the example shown in FIG. 7C, the back surface of front cover 740 is textured. Thin film 742 can include SiO2, TiO2, or Si3N4. Alternatively, the nanoparticles can be embedded within the encapsulant.

Fabrication Process

Figure 8:
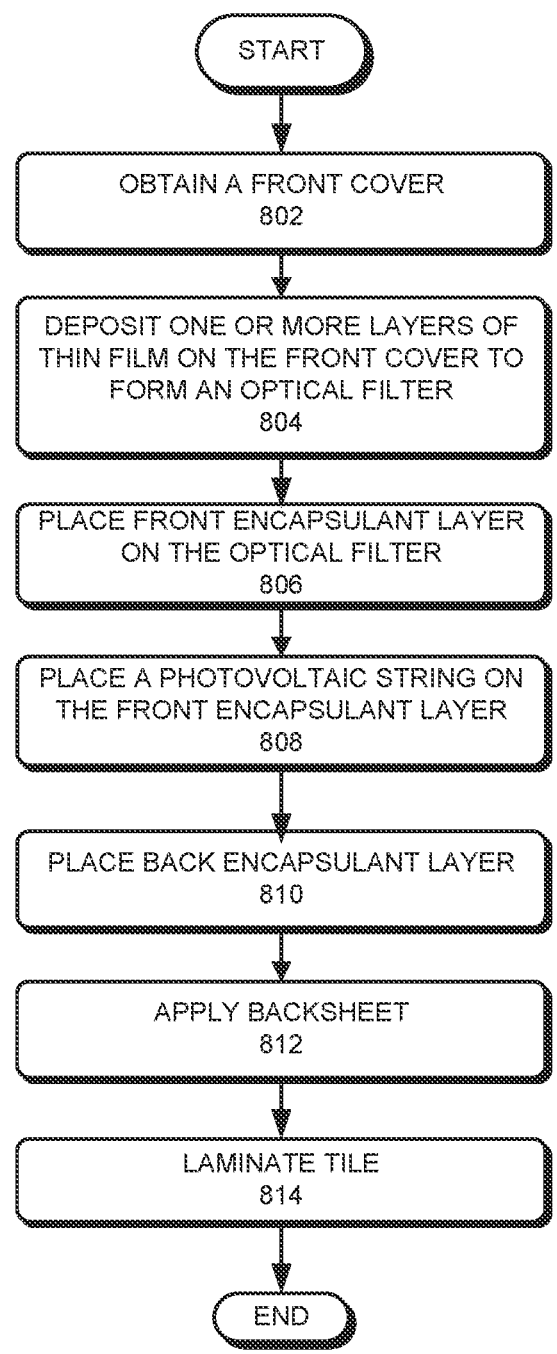
FIG. 8 shows an exemplary fabrication process of a solar roof tile, according to an embodiment of the invention.

FIG. 8 shows an exemplary fabrication process of a solar roof tile, according to an embodiment of the invention. During fabrication, a front cover of an appropriate size can be obtained (operation 802). Depending on the design, in some embodiments, the front cover can be large enough to accommodate at least two 6-inch square solar cells placed side by side. In some embodiments, the front cover can be made of tempered glass. One or more layers of thin film can be deposited on the back surface (e.g., the surface facing away from the sun) of the glass cover to form an optical filter (operation 804). The optical filter can include a single layer structure (e.g., an optical absorbing layer) or a multilayer structure (e.g., a film stack having an optical absorbing layer and one or more HR or AR layers). In some embodiments, these thin films can be deposited sequentially onto the glass cover using a PVD technique, such as evaporation or sputtering. If the back surface of the glass cover is patterned, a directional PVD process can be used to deposit the optical filter.

Subsequent to the formation of the optical filter on the front cover, a front encapsulant layer can be placed on the optical filter (operation 806) and a string of photovoltaic strips can be placed on the front encapsulant layer (operation 808). In some embodiments, a solar roof tile may include one string that comprises six cascaded strips. More specifically, photovoltaic strips can be obtained by dividing a standard square or pseudo-square solar cell into multiple pieces; and a string of strips can be formed by cascading multiple strips at the edges. The cascading forms a serial connection among the strips. Detailed descriptions about the formation of a cascaded string of photovoltaic strips can be found in U.S. patent application Ser. No. 14/826,129, entitled "PHOTOVOLTAIC STRUCTURE CLEAVING SYSTEM," filed Aug. 13, 2015; U.S. patent application Ser. No. 14/866,776, entitled "SYSTEMS AND METHODS FOR CASCADING PHOTOVOLTAIC STRUCTURES," filed Sep. 25, 2015; U.S. patent application Ser. No. 14/804,306, entitled "SYSTEMS AND METHODS FOR SCRIBING PHOTOVOLTAIC STRUCTURES," filed Jul. 20, 2015; U.S. patent application Ser. No. 14/866,806, entitled "METHODS AND SYSTEMS FOR PRECISION APPLICATION OF CONDUCTIVE ADHESIVE PASTE ON PHOTOVOLTAIC STRUCTURES," filed Sep. 25, 2015; and U.S. patent application Ser. No. 14/866,817, entitled "SYSTEMS AND METHODS FOR TARGETED ANNEALING OF PHOTOVOLTAIC STRUCTURES," filed Sep. 25, 2015; the disclosures of which are incorporated herein by reference in their entirety.

Subsequently, a back encapsulant layer can be placed on the photovoltaic string (operation 810) and a backsheet can be applied (operation 812). A lamination process can then be performed to encapsulate the string between the front cover and the backsheet to form a roof tile (operation 814).

Alternative Embodiments

In addition to implementing the band-block optical filter as part of the front cover of the solar roof tile, in some embodiments, it is also possible to implement the band-block optical filter as part of the encapsulant or as part of the photovoltaic structures.

Figure 9A:
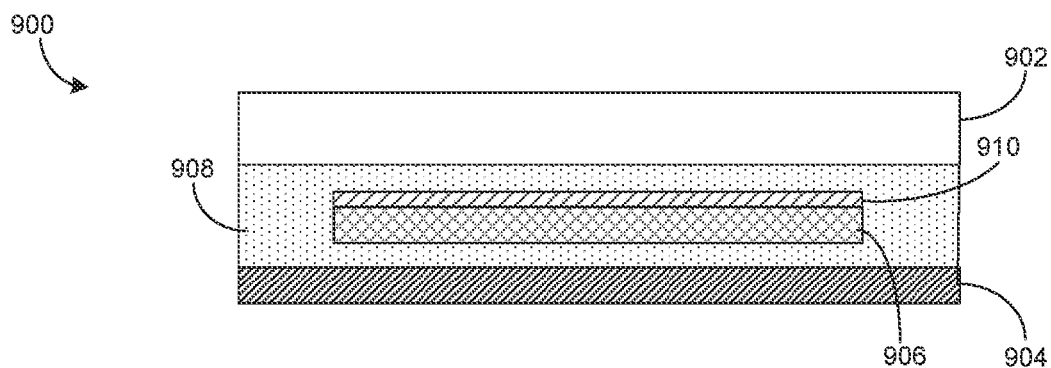
FIG. 9A shows the structure of an exemplary solar roof tile, according to one embodiment.

FIG. 9A shows the structure of an exemplary solar roof tile, according to one embodiment. Solar roof tile 900 can include front cover 902, backsheet 904, one or more photovoltaic structures 906, encapsulant 908 that encapsulates photovoltaic structures 906 between front cover 902 and backsheet 904, and band-block optical filter 910. Front cover 902, backsheet 904, photovoltaic structures 906, and encapsulant 908 can be similar, respectively, to front cover 502, backsheet 504, photovoltaic structures 506, and encapsulant 508 shown in FIG. 5A.

Optical filter 910 can be similar to optical absorbing layer 510 shown in FIG. 5A, multilayer film stack 520 shown in FIG. 5B, or multilayer film stack 600 shown in FIG. 6A. More specifically, optical filter 910 can block the passage of short-wavelength light. In some embodiments, optical filter 910 can be formed on top of photovoltaic structures 906 using a PVD technique. Note that, to ensure reliable electrical coupling among the photovoltaic strips, the optical filter may be formed on top of a cascaded string.

If band-block optical filter 910 relies on both reflection and absorption for spectral blocking (e.g., like optical filter 510 or 520), photovoltaic structures 906 will appear blue or purple to observers. Therefore, in order to "hide" the photovoltaic structures, backsheet 904 needs to have a blue or purple surface facing the photovoltaic structures. On the other hand, if band-block optical filter 910 relies on absorption only for spectral blocking (e.g., like optical filter 600), photovoltaic structures 906 will appear black to observers. To "hide" the photovoltaic structures, backsheet 904 needs to have a black surface facing the photovoltaic structures. Depending on the availability of the backsheet, one may choose different types of optical filters to integrate into the photovoltaic structures.

Figure 9B:
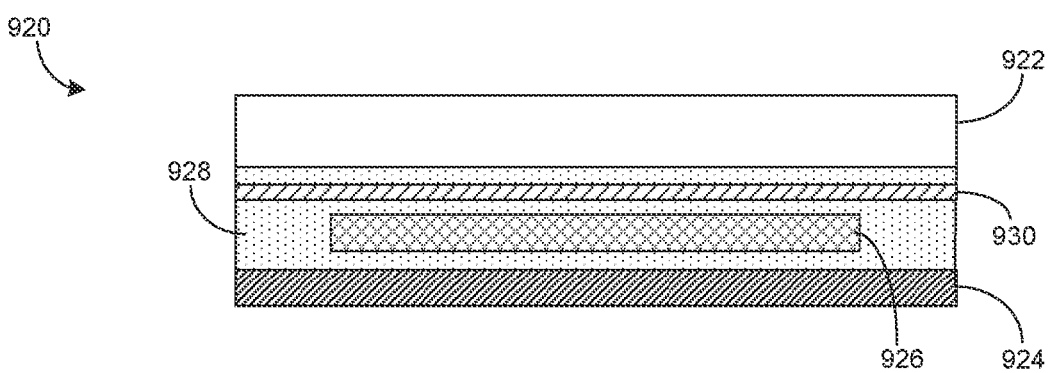
FIG. 9B shows the structure of an exemplary solar roof tile, according to one embodiment.

FIG. 9B shows the structure of an exemplary solar roof tile, according to one embodiment. In FIG. 9B, optical filter film 930 can be a standalone structure embedded within encapsulant 928, which also encapsulates photovoltaic structures 926 between front cover 922 and back cover 924. As long as optical filter film 930 is positioned between front cover 922 and photovoltaic structures 926, it can serve as a spectral block element to prevent light from reflecting off the surface of photovoltaic structures 926 to exit solar roof tile 920.

Optical filter film 930 can take on different forms. It can be similar to single layer structure 510 shown in FIG. 5A, bi-layer structure 520 shown in FIG. 5B, or multilayer structure 600 shown in FIG. 6A. Alternatively, optical filter film 930 can also include embedded nanoparticles.

The foregoing descriptions of various embodiments have been presented only for purposes of illustration and description. They are not intended to be exhaustive or to limit the invention to the forms disclosed. Accordingly, many modifications and variations will be apparent to practitioners skilled in the art. Additionally, the above disclosure is not intended to limit the invention.

What is claimed is:

1. A solar roof tile, comprising:
   a front cover;
   a back cover;
   one or more photovoltaic structures positioned between the front cover and the back cover and surrounded by encapsulant; and
   an optical filter positioned between the front cover and the one or more photovoltaic structures and separated from the one or more photovoltaic structures by at least a portion of the encapsulant, wherein the optical filter comprises:
   a layer of copper oxide,
   a first anti-reflection (AR) coating in direct contact with a first surface of the layer of copper oxide and disposed between the layer of copper oxide and the front cover, and
   a second AR coating positioned on a second surface of the layer of copper oxide.

2. The solar roof tile as recited in claim 1, wherein the layer of copper oxide is a copper oxide thin film.

3. The solar roof tile as recited in claim 2, wherein the first AR coating comprises a layer of transparent conductive oxide (TCO).

4. The solar roof tile as recited in claim 3, wherein the second AR coating comprises a layer of TCO.

5. The solar roof tile as recited in claim 1, wherein the first AR coating is formed from indium tin oxide (ITO).

6. The solar roof tile as recited in claim 5, wherein a thickness of the first AR coating is between 200 nm and 400 nm.

7. The solar roof tile as recited in claim 1, wherein the back cover comprises polyethylene terephthalate (PET), fluoropolymer, polyvinyl fluoride (PVF) or polyamide.

8. The solar roof tile as recited in claim 1, wherein a color of a surface of the back cover facing the one or more photovoltaic structure matches a color of the one or more photovoltaic structures.

9. The solar roof tile as recited in claim 1, wherein the one or more photovoltaic structures comprise a plurality of photovoltaic structures that partially overlap with each other in a shingled manner to form a serially coupled string.

10. The solar roof tile as recited in claim 1, wherein the layer of copper oxide is configured to absorb light having wavelengths of between 350 and 450 nm.

11. A cover for a solar roof tile, comprising:
    a layer of glass, which comprises a first surface facing incident sunlight and a second surface facing a plurality of photovoltaic structures within the solar roof tile and surrounded by encapsulant; and
    an optical filter positioned on the second surface of the glass layer and separated from the plurality of photovoltaic structures by a portion of the encapsulant, wherein the optical filter is configured to block light within a predetermined spectral range, thereby preventing the light from reflecting off surfaces of the photovoltaic structures to exit the solar roof tile, the optical filter, comprising:
    a layer of copper oxide,
    a first anti-reflection (AR) coating in direct contact with a first surface of the layer of copper oxide and disposed between the layer of copper oxide and the layer of glass, and
    a second AR coating positioned on a second surface of the layer of copper oxide.

12. The cover as recited in claim 11, wherein the layer of copper oxide comprises cuprous oxide.

13. The cover as recited in claim 12, wherein the first AR coating comprises a layer of transparent conductive oxide (TCO).

14. The cover as recited in claim 13, wherein the second AR coating comprises a layer of TCO.

15. The cover as recited in claim 12, wherein the first AR coating comprises a layer of indium tin oxide (ITO).

16. The cover as recited in claim 11, wherein a thickness of the first AR coating is between 200 nm and 400 nm.

17. The cover as recited in claim 11, wherein the optical filter is a multi-layer film stack deposited on the layer of glass sequentially using a physical vapor deposition technique.

* * * * *